United States Patent [19]

Clark et al.

[11] Patent Number: 4,965,527
[45] Date of Patent: Oct. 23, 1990

[54] GAIN EQUALIZER FOR MICROWAVE BALANCED AMPLIFIER CONFIGURATION

[75] Inventors: Robert T. Clark, Buena Park; Rick A. Crist, Chino, both of Calif.

[73] Assignee: Hughes Aircraft Company, Los Angeles, Calif.

[21] Appl. No.: 410,177

[22] Filed: Sep. 20, 1989

[51] Int. Cl.⁵ ............................................. H03F 3/68
[52] U.S. Cl. .................................. 330/124 R; 330/295
[58] Field of Search .................... 330/124 R, 295, 304; 333/28 R, 121, 117, 120

[56] References Cited

U.S. PATENT DOCUMENTS

| | | | |
|---|---|---|---|
| 3,652,952 | 3/1972 | Chen | 330/295 X |
| 3,973,214 | 8/1976 | Rheinfelder | 330/31 |
| 4,016,503 | 4/1977 | Rambo | 330/53 X |
| 4,086,543 | 4/1978 | Nigrin | 330/287 |
| 4,145,691 | 3/1979 | Freeling et al. | 343/7 AG |
| 4,283,684 | 8/1981 | Satoh | 330/295 X |
| 4,296,354 | 10/1981 | Neubauer | 315/3.5 |
| 4,307,322 | 12/1981 | Chaffee et al. | 315/3.5 |
| 4,371,847 | 2/1983 | Baird et al. | 330/307 |
| 4,381,485 | 4/1983 | Steinbrecher | 324/58 |
| 4,395,687 | 7/1983 | Belohoubek | 333/164 |
| 4,396,917 | 8/1983 | Tucker | 343/18 E |
| 4,464,636 | 8/1984 | Dobrovolny | 330/300 |
| 4,477,781 | 10/1984 | Reuss, Jr. | 330/124 R X |
| 4,490,684 | 12/1984 | Epsom et al. | 330/124 R X |
| 4,529,947 | 7/1985 | Biard et al. | 330/259 |
| 4,545,076 | 10/1985 | Baird et al. | 455/612 |
| 4,547,745 | 10/1985 | Freitag et al. | 330/286 |
| 4,701,716 | 10/1987 | Poole | 330/124 R X |
| 4,780,685 | 10/1988 | Ferguson | 330/124 |
| 4,825,177 | 4/1989 | Teague et al. | 330/295 |
| 4,841,262 | 6/1989 | Lomangino | 333/117 X |

Primary Examiner—James B. Mullins
Attorney, Agent, or Firm—Wanda K. Denson-Low

[57] ABSTRACT

A gain-equalized balanced microwave transistor amplifier configuration is disclosed. Two microwave amplifier circuits provide the power amplification. An input power divider divides the input signal into two signal components which are fed to the respective amplifier circuits by two transmission lines. The outputs for the amplifier circuits are fed to an output combiner by two additional transmission lines to provide a combined output signal. The desired gain equalization is provided through the loss of power due to phase error introduced by unequal transmission line lengths connecting the microwave transistor amplifiers to the output power combiner.

22 Claims, 6 Drawing Sheets

GAIN EQUALIZER FOR MICROWAVE BALANCED AMPLIFIER CONFIGURATION

BACKGROUND OF THE INVENTION

The present invention relates to gain equalizers used to equalize the gain of balanced microwave transistor amplifier configurations, and more particularly to an equalizer which provides the desired gain equalization through the loss of power due to phase error introduced by unequal transmission line lengths connecting the microwave transistor amplifiers to the output power combiner.

Microwave transistor amplifiers are used in both the transmitter and receiver amplifier chains of radar, communications and electronic warfare systems. Microwave transistors used in the amplifiers have a negative gain slope, i.e., the gain decreases as the frequency increases. Because microwave transistor amplifiers are used most commonly as preamplifiers or drivers, this gain slope must usually be compensated. In many applications, the RF drive power as a function of frequency has either a positive or a negative slope and at the same time the output power must have either a positive or a negative slope. In these applications the gain equalization may need be only partial or possibly compensate a positive slope rather than a negative slope usually associated with microwave transistors.

Obtaining both optimum transistor performance (maximum gain, maximum power, minimum junction temperature, etc.) and correct gain equalization has always been a very difficult task, one which has possibly never been achieved. Conventionally, gain equalizers are inserted between amplifier stages. This gain equalizer position usually requires an equalizer which has an impedance equal or nearly equal to the connecting transmission line impedance for the previous stage. This prevents changes in the source impedance for the following stage and changes in the load impedance. In many cases, this rules out purely reflective/mismatch type equalization unless combined with ferrite isolators which absorb the reflections and therefore maintain the load and source impedance for the previous stage and following stage respectively. In many applications the reflective/mismatch type equalization is derived from adjusting the input matching circuit and consequently the output matching circuit of the microwave transistors so as to provide the correct equalization. This scheme is difficult since one must optimize transistor performance while providing gain equalization through the adjustment of the input and consequently output matching circuits. These configurations require more parts, making it more difficult to manufacture and less producible In addition, the insertion loss and (reflection) mismatch of the ferrite circulator may also need to be compensated. Also, ferrite circulators are relatively difficult to design, tune and install, and are subject to significant performance variations over normally encountered environmental temperature excursions.

Four port hybrid devices combined with reflective mismatch type equalization have been used as the input divider to distribute input signals, and absorb the coherent reflections and therefore maintain the load impedance for the previous stage. However, in practice the reflections are difficult to maintain coherent while tuning to optimize other transistor characteristics and therefore the non-coherent reflections are not absorbed and change the load impedance as seen by the previous stage.

Parallel coupled line directional couplers have also been used in the past for gain equalizers. The length of the coupled lines is set equal to a half-wavelength at the frequency where no insertion loss is desired. As the frequency departs from this design frequency, the insertion loss of the coupler increases monotonically. This loss-frequency relationship can be used to offset the gain-frequency relationship of the amplifiers, thereby equalizing the gain over the bandwidth. Relatively tight coupling is required for any reasonable amount of equalization. A typical gain slope over a 12% bandwidth is 1.5dB. This would require an even and odd mode impedance of b 195.3 ohms and 12.8 ohms, respectively. These impedance values required TEM coupled line dimensions which are physically unrealizable in a practical sense. Increasing the length to multiples of half-wavelengths at the frequency of minimum insertion loss increases the sensitivity versus frequency and thereby slightly reduces the tight coupling requirement. Cascading of moderate coupling couplers is a possible solution to obtain a reasonable amount of equalization. However, all of these schemes: half-wavelength, multiple half-wavelength and cascading require either more layout space or are relatively difficult to manufacture.

Power dividers such as two branch hybrids and rat races are not usable for gain equalization in the same way as parallel coupled line directional couplers. These hybrids are not matched where the zero coupling and insertion loss occurs, as is the case for parallel coupled line couplers.

It would therefore represent an advance in the art to provide a gain equalizer which is relatively simple to construct, which does not require any additional loads for absorption of the unwanted signal power, does not significantly increase the insertion loss of the amplifier chain at the critical frequency where minimum insertion loss is desired, does not employ mismatches to degrade the performance of the microwave transistor amplifiers, and does provide a near continuum of monotonic gain equalization.

SUMMARY OF THE INVENTION

The invention relates to a gain-equalized microwave balanced amplifier configuration. The amplifier configuration includes an input power divider for dividing the input signal into first and second signal components, first and second microwave amplifier circuits each comprising an input matching circuit, an output matching circuit and a transistor amplifier, and an output power combiner for combining the amplifier signals into an output signal. The input divider and output combiners each comprise, in a preferred embodiment, four-port hybrids having a sum port, a difference port and two ports designated as output ports when used as the input divider and as input ports when used as the output combiner. A first transmission line connects the first output port of the input divider to the input matching circuit of the first microwave amplifier circuit. A second transmission line connects the second output port of the input divider to the input matching circuit of the second microwave amplifier circuit. The electrical length of the second transmission line exceeds that of the first line by a quarter-wavelength at the band center frequency.

A third transmission line connects the output matching circuit of the first microwave amplifier to a first input port of the output combiner. A fourth transmission line connects the output matching circuit of the second microwave amplifier circuit to a second input port of the output combiner. The electrical length of the third line exceeds that of the fourth line by a quarter-wavelength at the center frequency plus N/2 wavelengths at the band high end frequency.

In operation, the quarter-wavelength offset in the first and second lines provides a means of absorbing coherent reflections from the microwave amplifier circuits. The quarter-wavelength offsets in the second and third transmission lines are in different amplifier circuit paths and therefore phase compensate each other. The additional multiple half-wavelength offset introduces a phase error which affects the insertion loss such that the insertion loss increases as the frequency decreases. This insertion loss characteristic is used to compensate for the negative gain slope of the transistors.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
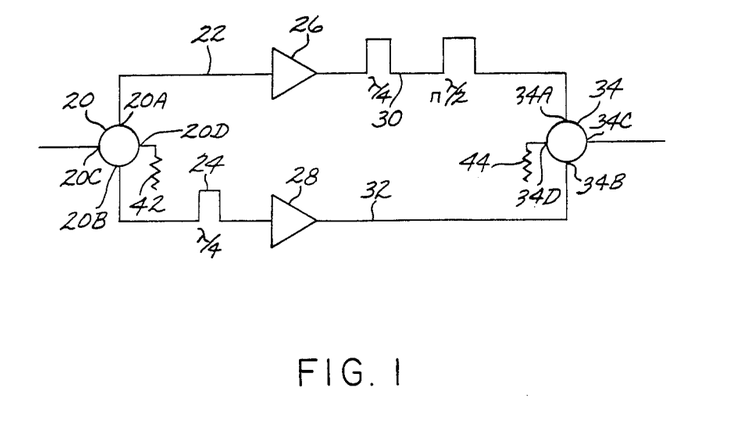
FIG. 1 is a schematic block diagram of a gain-equalized balanced microwave amplifier configuration embodying the invention.

Referring to FIG. 1, a gain equalizer for a microwave balanced amplifier configuration is shown. It will be appreciated that typically a plurality of such amplifiers are used in a cascaded arrangement so as to achieve the necessary power amplification The cascading is not shown in FIG. 1, as it is well known in the art to cascade the microwave amplifier configurations.

A four-port hybrid is used as the input divider 20 for the configuration. Transmission lines 22 and 24 connect the two output ports 20A and 20B of the input divider 20 to the inputs of the first and second microwave amplifier circuits 26 and 28. The respective electrical lengths of the transmission lines 22 and 24 are offset by a quarter-wavelength at the band center frequency; i.e., the electrical lengths of line 24 exceeds that of line 22 by a quarter-wavelength at the band center frequency.

Transmission lines 30 and 32 connect the respective outputs of the microwave amplifier circuits 26 and 28 to the input ports 34A and 34B of the output combiner 34. The electrical length of line 30 exceeds that of line 32 by a quarter-wavelength at the band center frequency plus N half-wavelengths at the high frequency end of the band.

The four-port hybrids, used as the input divider 20 and the output combiner 34, have a sum port, a difference port and two side arm ports designated as output ports when used as the input divider and as input ports when used as the output combiner. This four-port 180° hybrid in a practical microstrip implementation is commonly known as a Ratrace power divider, and in other implementations as a Magic Tee.

Figure 2:
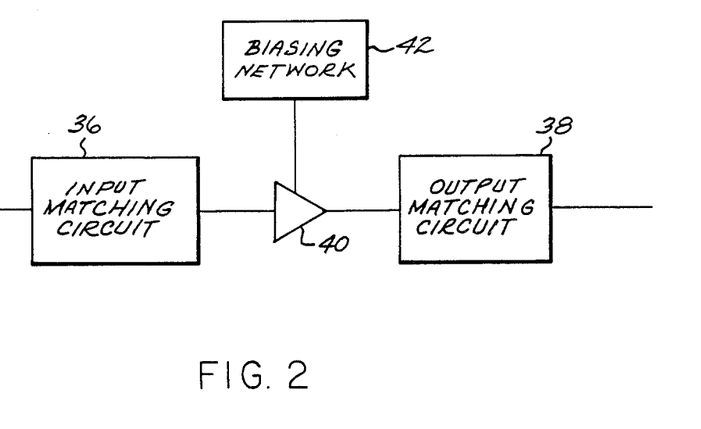
FIG. 2 is a schematic block diagram of a microwave amplifier circuit such as employed in the amplifier configuration of FIG.1.

The microwave amplifier circuits 26 and 28 each comprise input and output matching circuits 36 and 38, a transistor 40 and a biasing network 42, as shown in FIG. 2. These microwave amplifier circuit elements are conventional and well known in the art.

The complex input and output impedance of the microwave transistor 40 is measured over the frequency band of interest under the condition where the input and output impedances are simultaneously conjugately matched. This simultaneous conjugate match condition impedance data is then used to design the input and output matching circuits 36 and 38 that realize this simultaneous conjugate match condition impedance data. The input and output of the transistors 40 are conjugate matched to ensure maximum output power and minimum power dissipation within the transistor device. Any subsequent attempt to mismatch the input for reflective/mismatch type gain equalization would lead to certain difficulties, since the effective output impedance is no longer the same as when measured under the simultaneous conjugate match test condition. The following equations illustrate the relationship of the output impedance of the transistor ($Z_c$), the reflection coefficient ($\rho_c$) and the source complex reflection coefficient ($\Gamma_s$).

$$Z_c = \frac{1 + \rho_c}{1 - \rho_c}$$

$$\rho_c = S_{22} + \frac{S_{12}S_{21}\Gamma_s}{1 - S_{11}\Gamma_s}$$

where $S_{11}$, $S_{12}$, $S_{21}$ and $S_{22}$ represent the transistor scattering parameters.

A similar relationship holds for the input impedance. This approach of mismatching the transistor input to provide gain equalization has been practiced in the past and possibly accounts for many of the difficulties encountered.

The normal operation of the microwave amplifier configuration of FIG. 1 is as follows. An input signal enters the sum port 20C of the input divider 20 where it is divided into two equal amplitude and phase signals which exit the divider 20 via the output ports 20A and 20B to feed the amplifiers 26 and 28. The signals pass through the first set of offset length transmission lines 22 and 24 and are incident on the input matching circuits 36 comprising the respective amplifier circuits 26 and 28. The input matching circuit 36 matches the complex input impedance of the transistor 40 to the characteristic impedance of the corresponding transmission line 22 or 24. The signals are then amplified by the transistors 40.

The respective output matching circuits 38 match the complex output impedance of the respective transistor to the characteristic impedance of the respective transmission lines 30 and 32 that follow. The signals pass through the second set of transmission lines 30 and 32 and arrive at the input ports 34A and 34B of the output combiner 34 as signals which are equal amplitude but offset in phase, where the phase offset is a function of frequency.

The quarter-wavelength offsets in the first (22 and 24) and second (30 and 32) sets of transmission lines are in different amplifier paths and therefore phase compensate each other. The quarter-wavelength offset in the transmission lines 22 and 24 on the input side of the transistor amplifiers 26 and 28 provides a means of absorbing coherent reflections from the inputs to the amplifiers. These reflections sometimes occur and are due to the input matching circuit 36 not matching perfectly the complex input impedance of the transistor 40 to the characteristic impedance of the corresponding transmission line 22 or 24. The reflected signal from amplifier 28 is shifted twice the quarter-wavelength offset and arrives at the output 20B of the input divider 20 anti-phase with the reflected signal from amplifier 26 at port 20A from the other path. The input divider 20 combines these signals in the difference port 20D where they are absorbed by the load 42. This as well as the fact that the transistor amplifier circuits 26 and 28 are well matched provides a stable and proper load for the previous amplifier stage in a cascaded arrangement.

The signals incident on the input ports 34A and 34B of the output combiner 34 would be in phase if no other transmission line length offset were added. However, the additional multiple half-wavelength offset in transmission line 30 introduces a phase error ($\theta$) between these two signals as a function of frequency given by the following:

$$\theta = n\pi \, f/f_H,$$

where n = the number of half-wavelengths, f = the frequency of operation and $f_H$ = the frequency at the high end of the frequency band where zero insertion loss is required.

If 'n' is odd, the difference port of the output combiner 34 is used as the output port 34C of the balanced amplifier configuration and the sum port is loaded by load 44. If 'n' is even, the sum port of the output combiner 34 is used as the output port 34C of the balanced amplifier configuration and the difference port is loaded by load 44. The insertion loss (I.L.) for both cases, i.e., using the the sum or difference port as the output port of the output combiner 34, assuming no insertion loss from the power combiner, is given by eq. 1:

$$I.L._{\Sigma/\Delta} = 10 \, log \, ((1+(-1)^n \, cos\theta)/2) \qquad (1)$$

Figure 3A:
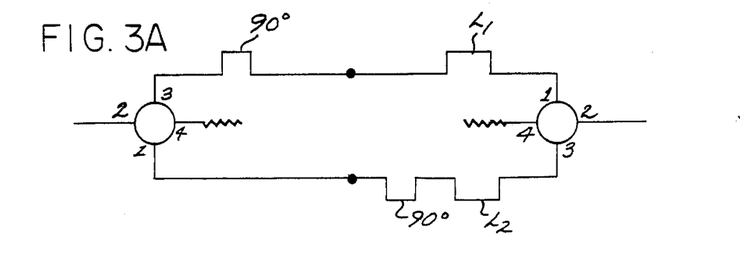
FIGS. 3A, 3B and 3C illustrate respectively plots of exemplary calculated insertion loss of the gain equalizer portion of the configuration of FIG. 1 (FIG. 3A), without (FIG. 3B) and with (FIG.3C) input divider and output combiner frequency sensitivity, as a function of frequency, with various multiple half-wavelength offsets as a parameter.
Figure 3B:
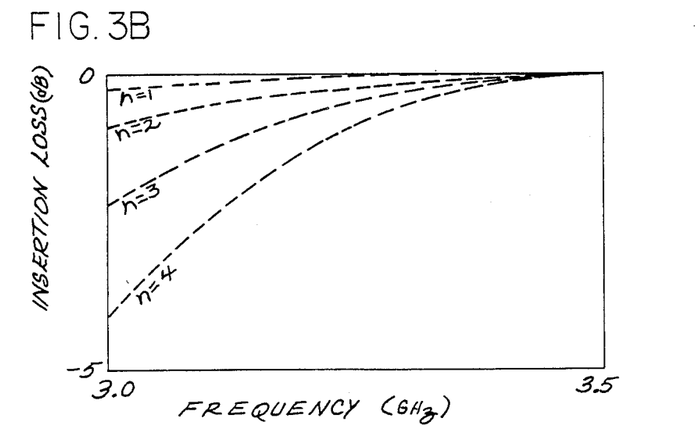
Figure 3C:
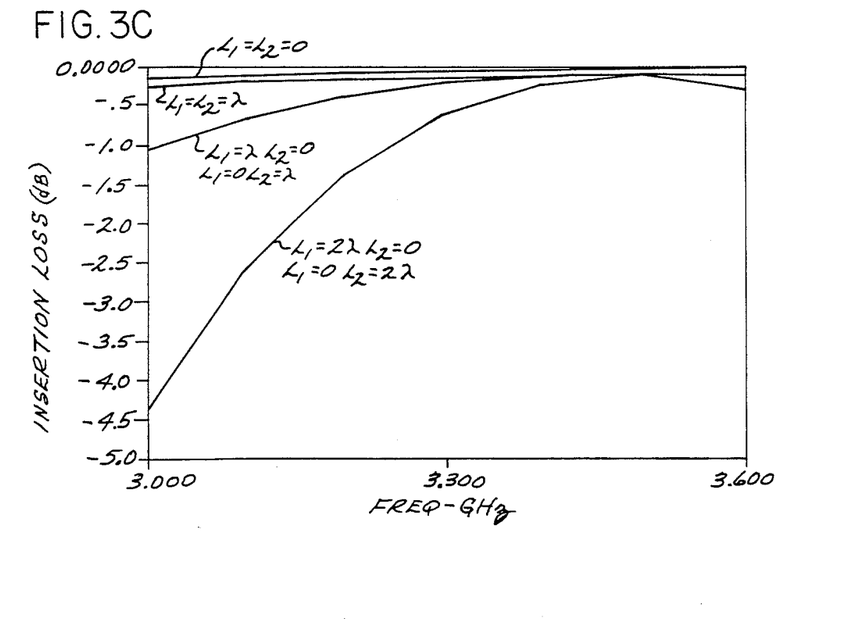

Plots of the calculated insertion loss versus frequency with various multiple half-wavelength offsets as a parameter are shown in FIG. 3B. If the analysis includes the sensitivity of the input divider and output combiner as well as the offset line length, with the elements of the microwave amplifier circuits 26 and 28 not included, a slight increase in insertion loss is experienced as shown in FIG. 3C. At the high end of the frequency band (3.5 GHz) the insertion loss is minimum if the offset line length is chosen to be "n" half wavelengths at the high end frequency. Moving down in frequency, the insertion loss increases monotonically until a frequency is reached where the phase error $\theta$ is $\pi$ radians less than the phase error ($\theta$) at the high end frequency. By varying the added line length slightly around its nominal value, a near continuum of gain equalization can be obtained.

Figure 4:
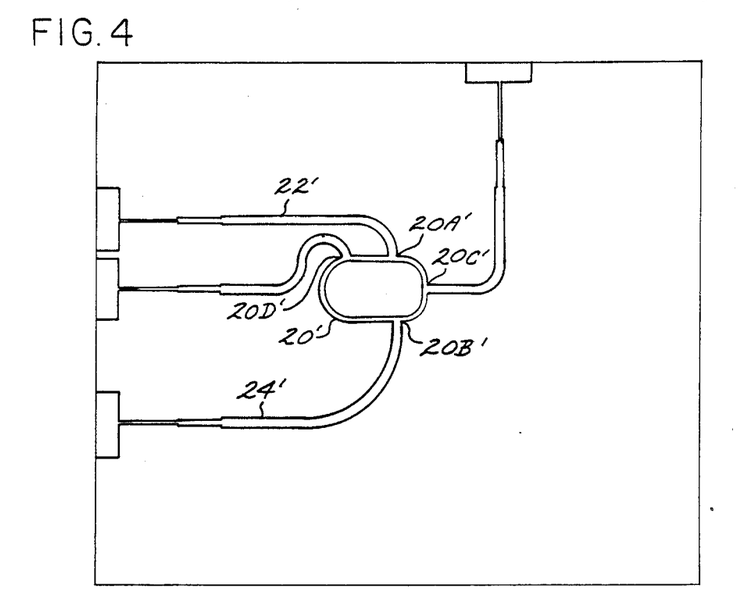
FIG. 4 illustrates a microstrip implementation of an input divider and input transmission lines which may be employed in a gain equalized microwave amplifier configuration in accordance with the invention.
Figure 5:
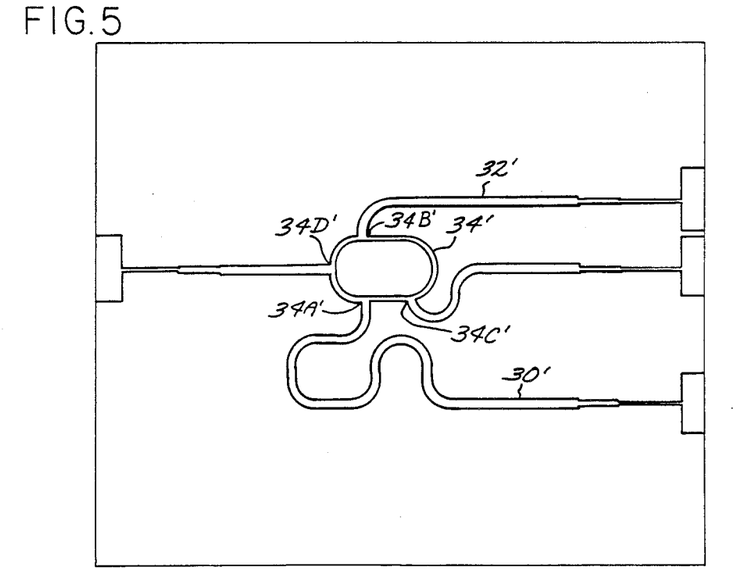
FIG. 5 illustrates a microstrip implementation of an output combiner and output transmission lines which may be employed in a gain equalized microwave amplifier configuration in accordance with the invention.
Figure 6:
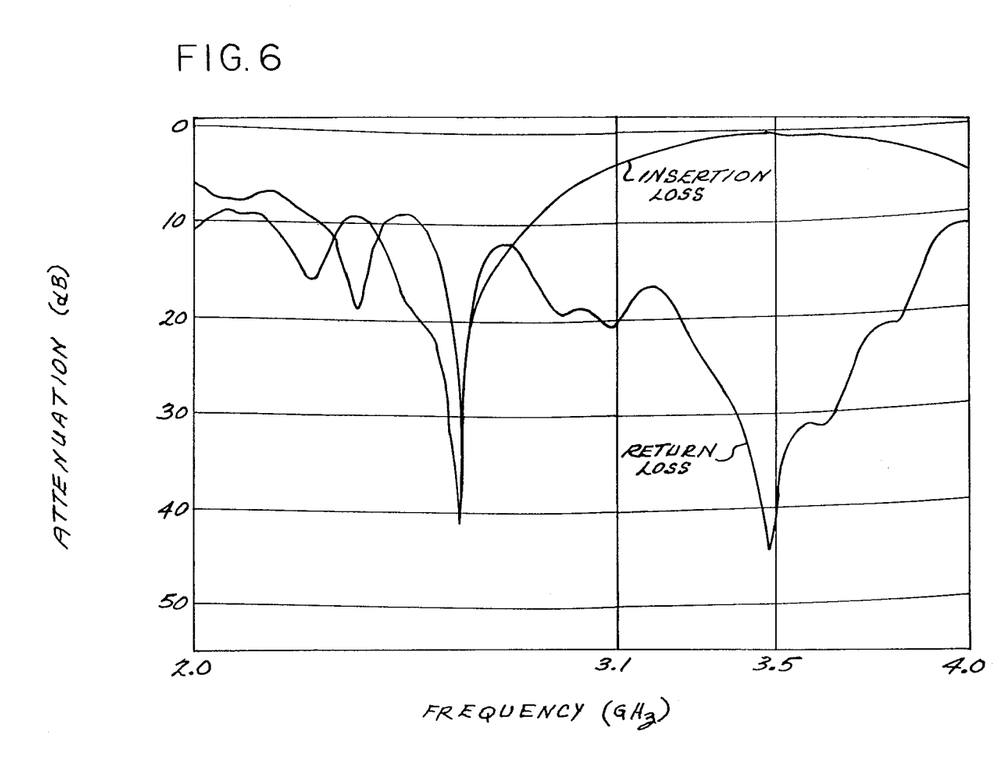
FIG. 6 is a plot of the insertion and return loss of the combined circuits of FIGS. 4 and 5.

In a preferred implementation, the gain equalizing circuitry is constructed in microstrip. A gain equalizer has been designed in microstripline medium to compensate a 2.5 dB negative gain slope over the 3.1 to 3.5 GHz. FIG. 4 illustrates the input power divider and the two transmission lines which connect the input divider to the microwave amplifier circuits. FIG. 5 illustrates the output power combiner and the two transmission lines which connect the microwave amplifier circuits to the input ports of the power combiner. Thus, in FIG. 4, the divider 20' includes an input port 20C' and the two output ports 20A' and 20B'. Transmission lines 22' and 24' are offset in electrical length by a quarter-wavelength at the band center frequency. Thus, in FIG. 5, the combiner 34' includes an output port 34D' and the two input ports 34A' and 34B'. Transmission line 30' and 32' are offset in electrical length by a quarter-wavelength at the band center frequency plus n/2 wavelengths at the band high edge frequency, where n = 2. It is to be understood that the microwave amplifier circuitry is not illustrated in FIGS. 4 and 5. The frequency response of the combined input divider and output combiner elements of FIGS. 4 and 5 is illustrated in FIG. 6.

Figure 7:
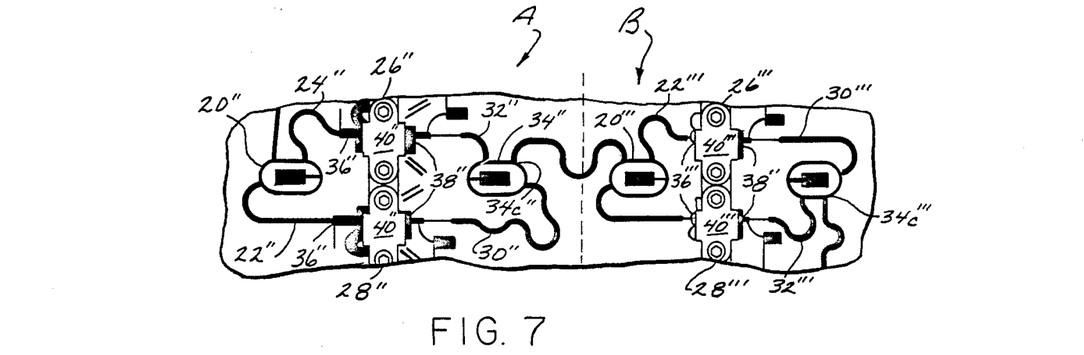
FIG. 7 illustrates a microstrip implementation of a gain equalized balanced microwave amplifier in accordance with the invention.

FIG. 7 illustrates the cascading of two microwave amplifier stages in a microstripline implementation, the first of which is gain equalized. FIG. 7 also illustrates the conductor pattern for a microstrip implementation comprising cascaded amplifier stages A and B. Stage A comprises input power divider 20", and first and second transmission lines 24" and 22" connecting the input power divider 20" to the input matching networks 36" comprising first and second microwave power amplifier circuits 26" and 28". Output matching circuits 38" are connected to the output combiner 34" by transmission lines 32" and 30". The amplifier circuits 26" and 28" further include the microwave transistors indicated generally as 40". The output of stage A is taken at port 34C" of combiner 34".

Stage B comprises input power divider 20‴ and transmission lines 20‴ and 22‴ connecting the divider 20‴ to the input matching circuits 36‴ of the amplifier circuits 26‴ and 28‴. The output matching circuits 38‴ of the amplifier circuits 26‴ and 28‴ are connected to the output combiner 34‴ by respective transmission lines 30‴ and 32‴. The output of stage B is taken at port 34C‴ of the combiner 34‴.

Figure 8:
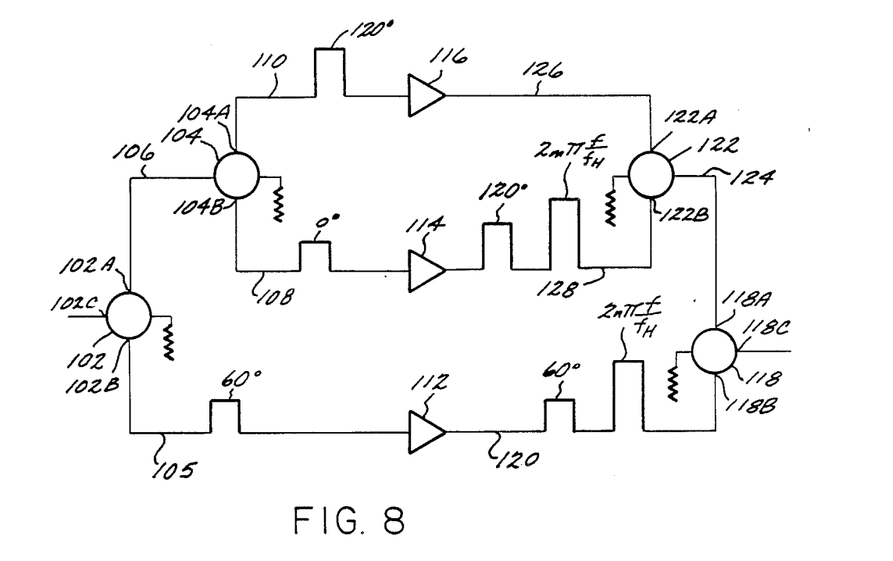
FIG. 8 is a schematic block diagram illustrating a three-way microwave amplifier configuration, gain equalized in accordance with the invention.

The present invention may be extended more generally to M-way microwave amplifier gain equalization. FIG. 8 illustrates a 3-way microwave transistor amplifier configuration employing gain equalization in accordance with the invention. Three-way power division of the input signal is achieved via Ratrace power dividers 102 and 104, wherein the power coupling ratio between output ports 102A and 102B of coupler 102 is selected to be 2:1, so that twice the power is fed to the input port of coupler 104 as is fed to the microwave amplifier circuit 112 via transmission line 105. The output port 102A of coupler 102 is connected via transmission line 106 to the input port of coupler 104, which divides the input power equally between output ports 104A and 104B. Port 104A is connected to the input of microwave amplifier circuit 116 via transmission line 110. Port 104B is connected to the input of microwave amplifier circuit 114 via transmission line 108. The length of transmission line 105 and the composite length of lines 106 and 108 are selected such that line 105 provides an additional 60° phase shift at the center frequency compared to the composite length of lines 106 and 108, and the composite length of lines 106 and 110 provide an additional 120° phase shift over that of line 105. Reflections from the microwave amplifier circuits are therefore absorbed by the loads connected to the couplers 102 and 104, in a manner similar to that described above with regard to the two-way configuration. In essence, the differential line lengths are selected so that reflections from the amplifier circuits are absorbed by the loads at the couplers 102 and 104.

The output of amplifier circuit 112 is connected to the input port 118B of the output Magic Tee coupler 118 via transmission line 120. The output of amplifier circuit 114 is connected to the input port 122B of Magic Tee coupler 122 via transmission line 128. The output of amplifier circuit 116 is connected to the input port 122A of coupler 122 via transmission line 126. The output of coupler 122 is connected to the input port 118A of coupler 118 via transmission line 124.

The length of transmission line 120, the composite length of lines 124 and 128, and the composite length of lines 124 and 126 are selected such that, relative to the composite length of lines 124 and 126, line 120 provides an additional 60° at the center frequency plus $2n\pi f/f_H$ radians of phase shift at the high end frequency. The composite length of lines 124 and 128 provides an additional 120° phase shift at the center frequency plus $2m\pi f/f_H$ radians of phase shift at the high end frequency. The respective 60° and 120° phase shifts are added so that each of the three amplifier circuit channels has 120° phase shift, cancelling out the effect of the 60° and 120° phase shifts in the lines 105 and 110, respectively.

It will be apparent then, that in the generalized M-way amplifier configuration employing the invention, one of the transmission lines connecting an amplifier circuit to the output power combiner will have the shortest electrical length, which may be considered a reference electrical length, and wherein the effective electrical lengths of the remaining transmission lines connecting others of the amplifier circuits to the output combiner exceed the reference electrical length by respective factors of $2a_i\pi f/f_H$, $i=1$ to $(M-1)$, where the $a_i$ are integer parameters, f - the frequency of operation and $f_H =$ the frequency at the high end of the frequency band of operation.

Figure 9:
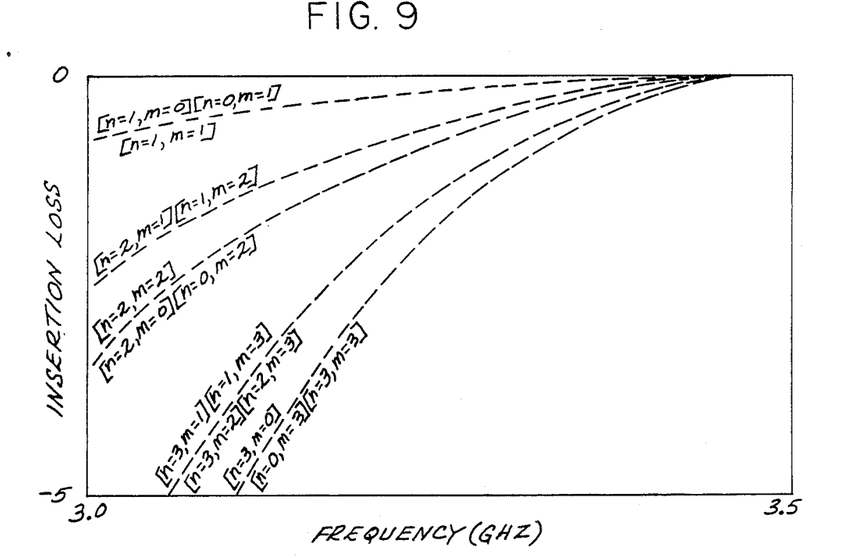
FIG. 9 is a graph plotting the insertion loss of the configuration of FIG. 8 as a function of frequency and for various parameter values.

The insertion loss of the three-way configuration of FIG. 8 is shown in FIG. 9, for various values of n and m.

Figure 10:
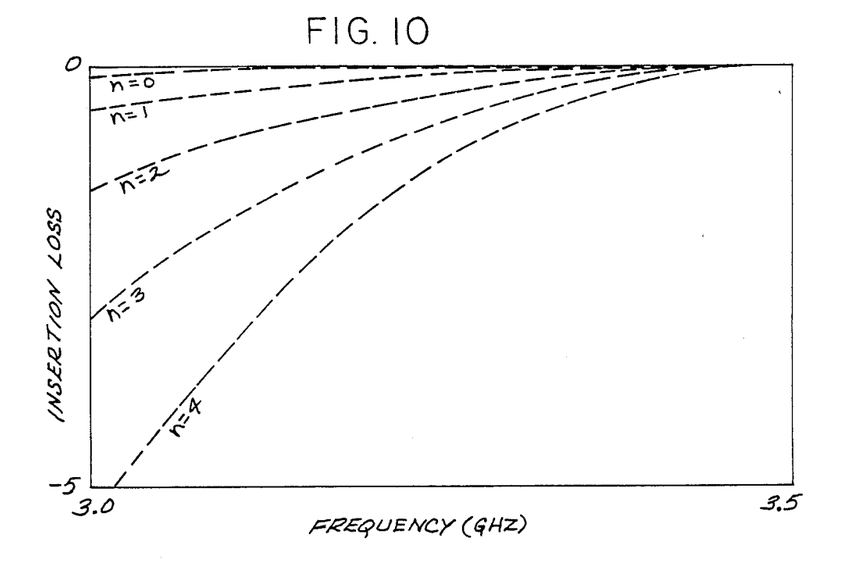
FIG. 10 is a graph plotting the insertion loss of a modified form of the configuration of FIG. 1 as a function of frequency and for various parameter values.

In another embodiment, the gain-equalized amplifier configuration of FIG. 1 is modified by substituting a 90° hybrid coupler, typically a two branch hybrid, for the 180° hybrid coupler, typically a Ratrace used as the output coupler 34, so that a quarter-wavelength differential line length ($n\lambda/4$) can be used in place of the half-wavelength line length ($n\lambda/2$) in transmission line 30 to introduce the differential phase shift error between the two output signals to be combined. The theoretical insertion loss (IL) due to the differential phase error is given by eq. 2, and is plotted in FIG. 10, for the frequency range of 3.0 to 3.5 GHz:

$$IL = 10 \log [(1+(-1)^n \sin((n+\tfrac{1}{2})\pi f/f_H))/2] \qquad (2)$$

This alternate embodiment provides additional insertion loss characteristics available for gain equalization. Thus the circuit designer can select the appropriate configuration in dependence on the gain slope equalization requirements for a particular application.

The gain equalizer can alternatively be used to equalize amplifier circuits having a positive gain slope. In this case, the N half-wavelength line length would be at that frequency in the band having minimum gain, so that as the frequency increases, the loss from the gain equalizer increases, compensating the increased gain of the amplifier circuit.

It is understood that the above-described embodiments are merely illustrative of the possible specific embodiments which may represent principles of the present invention. Other arrangements may readily be devised in accordance with these principles by those skilled in the art without departing from the scope of the invention.

What is claim is:

1. In an M-way microwave balanced amplifier configuration comprising an input power divider for dividing an input signal into M signal components at M respective output ports, M microwave amplifier circuits for amplifying corresponding ones of the M signal components and characterized in that the gain of the circuits decreases or increases with increasing signal frequency within the frequency band of operation, M input transmission lines for connecting respective ones of the output ports of the input divider to respective ones of the inputs to the M amplifier circuits, an output power combiner for combining the signals received at M input ports into a combined output signal at an output port, and M output transmission lines for connecting respective ones of the outputs of said M amplifier circuits to respective ones of the inputs of the output combiner, there being M signal paths between the input divider and output combiner defined by said M input lines, said M amplifier circuits and said M output lines, a gain equalizer for equalizing the gain slope of the amplifier circuits over the frequency band of operation to minimize output variations over the frequency band, said equalizer comprising unequal electrical lengths of said M signal paths, the inequalities selected so that gain equalization is achieved over the frequency band of operation through the loss of power due to phase errors in the signals combined at the output combiner.

2. The gain equalizer of claim 1 wherein said output combiner comprises a 180° hybrid coupler, and the inequality between the respective electrical lengths of said M signal paths is $n\lambda/2$, where $\lambda$ represents the wavelength at a frequency of operation within the frequency band selected as the frequency where loss of power due to phase errors is zero and where n represents an integer.

3. The gain equalizer of claim 1 wherein said output combiner comprises a 90° hybrid coupler, and the inequality between the respective electrical lengths of said M signal paths is $n\lambda/4$, where $\lambda$ represents the wavelength at a frequency of operation within the frequency band selected as the frequency where loss of power due to phase errors is zero and where n represents an integer.

4. The gain equalizer of claim 1 wherein said M input lines, said M output lines, said input power divider and said output power divider are implemented in microstripline medium.

5. The gain equalizer of claim 4 wherein M-2 and said input divider and said output combiner each comprise a 180° hybrid coupler, and wherein the inequality between the respective electrical lengths of said M signal paths is $n\lambda/2$, where $\lambda$ represents the wavelength at a frequency of operation within the frequency band selected as the frequency where loss of power due to phase errors is zero and where n represents an integer.

6. The gain equalizer of claim 4 wherein M=2, said input divider comprises a 180° hybrid coupler, said output combiner comprises a 90° hybrid coupler, and the inequality between the respective electrical lengths of said M signal paths is $n\lambda/4$, where $\lambda$ represents the wavelength at a frequency of operation within the frequency band selected as the frequency where loss of power due to phase errors is zero and where n represents an integer.

7. A microwave balanced amplifier configuration which is gain-equalized over a frequency band to minimize output power variations over the frequency band, comprising:
first and second microwave amplifier circuits, each comprising an input impedance matching circuit, a transistor amplifier and an output impedance matching circuit, said microwave amplifier circuits characterized in that the gain of the circuit decreases with increasing signal frequency within the band;
means for dividing an input signal into at least first and second signal components;
means for providing said first signal components as an input to said first amplifier circuit and said second signal component as an input to said second amplifier circuit;
an output power combiner for combining the power received at first and second input ports and providing a combined output signal at an output port; and
first and second transmission lines, said first line for connecting the output matching circuit of said first microwave amplifier circuit to said first input port of said output combiner, said second line for connecting the output matching circuit of said second microwave amplifier circuit to said second input port of said output combiner, said first transmission line having an electrical length which exceeds that of said second line by n/2 wavelengths at the high frequency end of the frequency band, where n represents an integer,
whereby gain equalization over the frequency band is achieved through the loss of power in the signals combined at the output combiner due to phase errors which result from the inequality in the electrical lengths of the first and second transmission lines.

8. The configuration of claim 7 wherein said output combiner comprises a four-port hybrid coupler having a sum port, a difference port and two input ports, and wherein said difference port is used as said combiner output port and a load is coupled to said sum port when the value of n is odd.

9. The configuration of claim 8 wherein said hybrid coupler comprises a 180° hybrid coupler.

10. The configuration of claim 7 wherein said transmission lines and said hybrid coupler are implemented in microstripline medium, and said hybrid coupler is a 180° hybrid coupler.

11. The configuration of claim 7 wherein said output combiner comprises a four-port hybrid coupler having a sum port, a difference port and two input ports, and wherein said sum port is used as the combiner output port and a load is coupled to said difference port when the value of n is even.

12. A microwave balanced amplifier configuration which is gain-equalized over a frequency band to minimize output power variations over the frequency band, comprising:
an input power divider for dividing an input microwave frequency signal into first and second signals of equal power and phase at first and second output ports;
first and second microwave amplifier circuits, each comprising an input impedance matching circuit, a transistor amplifier and an output impedance matching circuit;
first and second transmission lines, said first line for connecting said first output port of said input power divider to the input matching circuit of said first microwave amplifier circuit, said second line for connecting said second output port of said input power divider to the input matching circuit of said second microwave amplifier circuit, said second transmission line having an electrical length which exceeds that of said first line by a quarter-wavelength at the band center frequency;
an output power combiner for combining the power received at first and second input ports and providing a combined output signal at an output port; and
third and fourth transmission lines, said third line for connecting the output matching circuit of said first microwave amplifier circuit to said first input port of said output combiner, said fourth line for connecting the output matching circuit of said second microwave amplifier circuit to said second input port of said output combiner, said third transmission line having an electrical length which exceeds that of said fourth line by a quarter-wave-length at the band center frequency plus n/2 wavelengths at the high frequency end of the band, where n represents an integer.

13. The configuration of claim 12 wherein said output combiner comprises a four-port hybrid coupler having a sum port, a difference port and two input ports, and wherein said difference port is used as said combiner output port and a load is coupled to said sum port when the value of n is odd.

14. The configuration of claim 13 wherein said hybrid coupler comprises a 180° hybrid coupler.

15. The configuration of claim 13 wherein said transmission lines and said hybrid coupler are implemented in microstrip technology, and said hybrid coupler is a 180° hybrid coupler.

16. The configuration of claim 12 wherein said output power combiner comprises a 180° hybrid coupler.

17. The configuration of claim 12 wherein said output combiner comprises a four-port hybrid coupler having a sum port, a difference port and two input ports, and wherein said sum port is used as the combiner output port and a load is coupled to said difference port when the value of n is even.

18. Am M-way microwave balanced amplifier configuration which is gain-equalized over a frequency band to minimize output power variations over the frequency band, comprising:

M microwave amplifier circuits, each comprising an input impedance matching circuit, a transistor amplifier and an output impedance matching circuit, each of said microwave amplifier circuits characterized in that the gain of the circuit decreases with increasing signal frequency within the band;

means for dividing an input signal into M signal components of equal power;

means for providing a corresponding one of said signal components as an input to each of said amplifier circuits;

output power combiner means for combining the power received at M input ports from the respective outputs of said M microwave amplifier circuits and providing a combined output signal at an output port; and M transmission lines for connecting the respective output matching circuits of each said microwave amplifier circuit to a corresponding one of said input ports of said output combiner means; and wherein one of said M lines is characterized by a reference electrical length, and respective ones of the other said lines having lengths which exceed the reference electrical length by factors of $2a_i \pi f / f_H$, $i = 1$ to $(M-1)$, where the $a_i$ are integer parameters, $f$ = the frequency of operation and $f_H$ = the frequency at the high end of the frequency band of operation, whereby gain equalization over the frequency band is achieved through the loss of power in the signals combined at the output combiner due to phase errors which result from the inequalities in the electrical lengths of the M transmission lines.

19. The configuration of claim 18 wherein said output combiner comprises a four-port hybrid coupler having a sum port, a difference port and two input ports, and wherein said difference port is used as said combiner output port and a load is coupled to said sum port when the value of $a_i$ is odd.

20. The configuration of claim 19 wherein said hybrid coupler comprises a 180° hybrid coupler.

21. The configuration of claim 18 wherein said transmission lines and said hybrid coupler are implemented in microstripline medium, and said hybrid coupler is a 180° hybrid coupler.

22. The configuration of claim 18 wherein said output combiner comprises a four-port hybrid coupler having a sum port, a difference port and two input ports, and wherein said sum port is used as the combiner output port and a load is coupled to said difference port when the value of $a_i$ is even.

* * * * *